Aug. 24, 1965 E. S. NANCE 3,202,752

HEAT DISSIPATING ELECTRICAL SHIELD

Filed July 23, 1962

INVENTOR.

EVERETT S. NANCE

BY Fulwider, Patton, Rieber, Lee, & Utecht

ATTORNEYS 3,202,752

HEAT DISSIPATING ELECTRICAL SHIELD

Everett S. Nance, Rosemead, Calif., assignor to Cool Fin Electronics Corporation, South El Monte, Calif., a corporation of Nevada Filed July 23, 1962, Ser. No. 211,700
7 Claims. (Cl. 174—35)

The present invention relates generally to the electronic art, and more particularly to heat dissipating, electrical shields for electronic components such as vacuum tubes and semiconductor devices.

In the operation of electronic components such as vacuum tubes and semiconductor devices which have nonmetallic envelopes, it is desired to shield the component elements from ambient electrical fields and thereby prevent undesirable feedback, oscillation, interference and noise. Some shields of the prior art reflect and retain the heat generated by operation of the electronic component within its envelope, greatly increasing the operating temperature and seriously decreasing the life and operating reliability thereof.

The shield according to the present invention also functions as an efficient heat dissipating device because of its effective contact with the component envelope and the conducting of the heat therefrom and radiated from the component elements to augmented heat dissipating surfaces provided by fins extending outwardly from the shield. Also, in the shield according to the present invention, heat from the component envelope and elements is conducted through the shield to the chassis of electronic equipment on which the component is mounted.

It is an object of the present invention to provide an improved and economical heat dissipating electrical shield for electronic components.

Another object of this invention is the provision of an improved heat dissipating, electrical shield for electronic components of simple and economical construction, and combining effective shielding of the component elements against ambient electrical fields with superior heat removal characteristics for lowering the operating temperature within the component.

A further object of this invention is the provision of an improved heat dissipating electrical shield for an electronic component combining maximum area of contact with the component envelope with increased contact pressure between the inner surface of the shield and the outer surface of the component envelope to lower the heat resistivity to the surface engagement.

Yet another object of this invention is the provision of an improved heat dissipating electrical shield having an economical construction and providing a high heat conductivity path from the component contacting interior surface of the shield to the connection of the shield with a socket ring mounted on an equipment chassis in good heat conducting relation therewith.

A still further object of this invention is the provision of an improved heat dissipating, electrical shield for an electronic component having superior resistance against vibration and shock.

These and other objects and features of this invention will be readily apparent to those skilled in the art from the following description of a presently preferred embodiment of the invention and the appended drawing thereof, in which.

Figure 1:
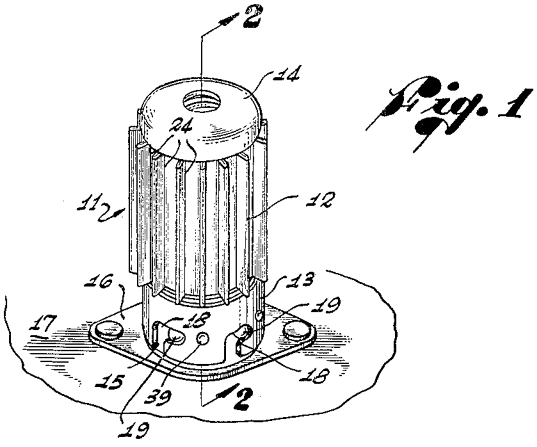
FIGURE 1 is a perspective view of a heat dissipating, electrical shield according to the present invention mounted upon a socket ring.

The heat dissipating, electrical shield according to the present invention is indicated generally at 11, and comprises a body portion 12, a depending skirt portion 13, and a cap 14. In the perspective view of FIGURE 1, the shield 11 is shown mounted on and secured to a socket ring 15 in good electrical and heat conducting contact therewith. The socket ring 15 has integral flanges 16 projecting therefrom and secured in good electrical and heat conducting contact with the chassis 17 of the electronic equipment with which the component, such as a vacuum tube, is associated. The equipment chassis thereby serves both to ground the shield 11 and as a heat sink for the heat conducted thereto from the electronic component by the shield. The skirt 13 of the shield 11 is provided with a plurality of inverted L-shaped slots 18 by which the shield is secured to the ring 15 through engagement therein of projections 19 on the exterior of the ring. The shield 11 is mounted on the ring 15 by first an axial and then a rotary movement to engage the projections 19 in the slots 18.

Figure 4:
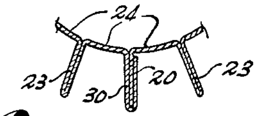
FIGURE 4 is a detail transverse sectional view along the line 4—4 of FIGURE 3.

The body portion 12 of the shield is formed from a continuous strip of light gauge electrical and heat conducting material, preferably a metal such as an aluminum or beryllium-copper alloy. The sheet metal strip is provided with relatively wide slots at the top and bottom to form top strips 21 and bottom strips 22, and the material between the upper and lower slots is folded or returnbent centrally thereof to form the fins 23 and bring the strips together. The sheet metal strip is then bent into a cylindrical form to produce the transversely curved, axially extending strips 24. The folds forming the fins 23 are preferably substantially closed, as shown in FIGURE 4, so that the strips 24 form a substantially continuous cylindrical surface for engagement with the envelope of the electron tube or similar component and have the fins 23 projecting outwardly from and extending longitudinally of the cylindrical surface. The sheet metal strip is joined together circumferentially as shown in FIGURE 4 by the engagement of a longitudinally extending, outwardly projecting flange 20 at one end in a complementary, U-shaped socket 30 on the other end.

Figure 3:
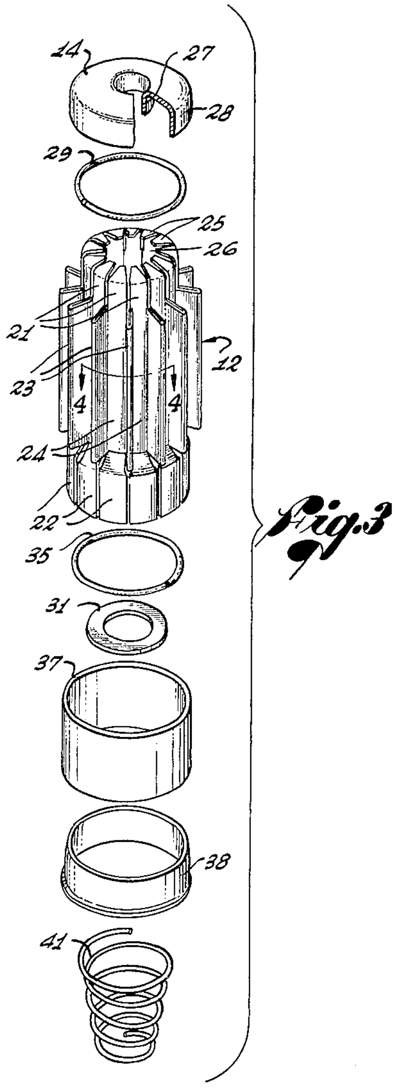
FIGURE 3 is an exploded perspective view of the elements making up the shield of FIGURES 1 and 2.
Figure 2:
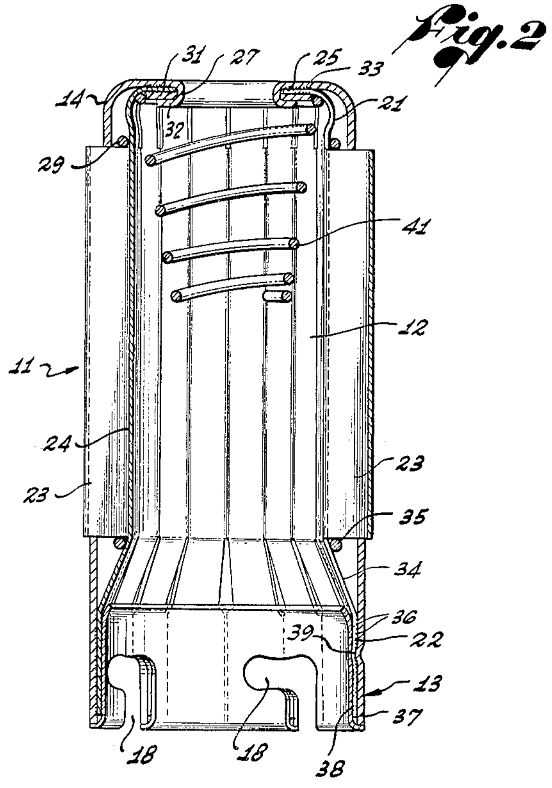
FIGURE 2 is a vertical sectional view through a heat dissipating, electrical shield according to the present invention, taken on the line 2—2 of FIGURE 1.

The upper ends 25 of the strips 21 are clipped at opposite sides and bent inwardly, as shown in FIGURES 2 and 3, to form a partial top surface having a central opening 26. The cap 14 includes inner and outer depending flanges 27 and 28 and, after a ring 29 of spring material such as beryllium-copper is placed over the strips 21 just above the fins 23, the cap 14 is mounted over the body portion 12 with the depending flange 28 enclosing the strips 21 and the spring ring 29 and the flange 27 extending through the opening 26. A cementing, brazing or soldering bonding material is placed between the ends 25 of the strips 21 and the inner surface of the cap 14 before assembly of the cap, a washer 31 is placed under the ends 25 and about the flange 27 of the cap, and then the flange 27 is spun over, as at 32 in FIGURE 2, to mechanically join together the cap 14, the ends 25 of the strips 21, and the washer 31.

The bonding material is indicated at 33, and may be placed on only the upper or on both sides of the ends 25 to securely bond the strips 21 to the cap 14. Thus, the cap 14 is connected to the body portion 12 by both the mechanical connection provided by the spun over portion 32 of the cap flange 27, and also by the bonding material 33. One bonding medium which has proved effective for the material 33 is a high-temperature resistant epoxy cement having flake copper or silver distributed therethrough to increase its electrical and thermal conductivity. Instead of the epoxy cement, any electrical and thermal conducting solder or brazing material bonding to the material of the body portion 12 and the cap 14 may be used.

In the forming of the sheet metal strip for the body portion 12, the bottom strips 22 are offset by portions 34 to space the ends of strips 22 outwardly of the component envelope engaging strips 24. A spring ring 35 of, for example, beryllium-copper, is placed about the bottom strips 22 immediately beneath the fins 23. Both the inner and the outer surfaces of the strips 22 are then coated with a cementing, brazing or soldering bonding material at 36, which may be the same as the examples given for the material 33. An outer cylindrical sleeve 37 is slipped over the outer surfaces of the strips 22 and an inner cylindrical sleeve 38 is slipped within the inner surfaces of the strips 22, so that the strips 22 will be secured between and bonded to the concentric sleeves 37 and 38 which, together with the strips, form the depending skirt 13. After assembly, the inner cylindrical sleeve 38 may be expanded to size with a sizing mandrel and the sleeves 37 and 38 and the strips 22 mechanically locked together by means of swaged dimples 39.

If a heat setting epoxy cement is used for the bonding material 33, 36, the shield is now baked at the fixing or setting temperature for the material; for example, 300° F. for a representative epoxy resin. If soldering or brazing materials are utilized for the bonding material 33, 36, the shield may be subjected to high frequency heat to melt these materials. After the material 33, 36 is set, the inverted L-shaped slots 18 are punched into the skirt 13.

The shield may now be given a hot-dip, black coating to protect against corrosion, such as Alodine 1200; and a final coating is preferably applied which is a thermal conducting black with high absorption and emissivity characteristics. An example of such a final coating includes graphite having admixed therein, molybdenum disulfide, lead sulfide, and silver. This coating is also a dry lubricant to prevent seizing of the shield.

The main body portion 12 and the rings 29 and 35 are so shaped and sized with respect to the outer diameter of the component envelope with which they are to be associated, that the cylindrical surface provided by the strips 24 has a diameter slightly less than the diameter of the component envelope. Therefore, as the shield is mounted over the component, the strips 24 separate slightly and engage the outer surface of the component under resilient pressure from the material of the folded fins 23 and also under the pressure exerted by the springs 29 and 35. This provides for low heat resistivity contact between the strips 24 and the component envelope to effect efficient transfer of heat from the component envelope to the shield. It will be noted that the strips 24 form a substantially continuous cylindrical surface, so that substantially the entire periphery of the component envelope is engaged in good heat conducting relation by the shield for even abstraction of heat therefrom.

In addition to the conduction of heat from the component envelope, the shield will also readily absorb heat radiated directly from the component elements within the envelope. The heat abstracted from the component envelope and from the elements therein is conducted to the outer surfaces of the shield where it is dissipated into the ambient by radiation, conduction and convection. The fins 23 provide greatly augmented heat dissipating surfaces for heat dissipation from the component.

The heat abstracted from the component envelope and from the elements therein is also conducted by the shield to the skirt 13 thereof, whence it passes to the ring 15 and the electronic equipment chassis 17 which acts as a heat sink.

The shield further serves to securely retain the electronic component, such as a vacuum tube, within its socket in the equipment chassis, and also to protect the tube against vibration and shock. A conical spiral spring 41 within the shield engages the top of the electron tube or other component under compression, with the shield held tightly in position by the engagement of the projections 19 in the slots 18.

Where the body portion 12 of the shield is formed of a good spring material, such as beryllium-copper, sufficient contact pressure between the shield and component surfaces for good heat conduction may be obtained from the inherent resilience of the material alone, without resorting to the added spring rings 29 and 35.

The heat dissipating, electrical shield according to the present invention is of lightweight, but vibration and shock resistant construction. It is an efficient conductor and dissipator of heat, disposing of waste heat from the component envelope and the elements therein both by conduction to the equipment chassis and by radiation, conduction and convection to the ambient atmosphere. Heat dissipation from the shield is greatly increased by the greatly augmented surface area provided by the addition of the fins 23 to the surface area represented by the diameter of the cylinder constituting the shield proper.

Pressure contact is provided between the inner surfaces of the shield and the outer surface of the component envelope, and this contact is effected over substantially the entire surface of the component envelope for substantially even transfer of heat therefrom and the prevention of hot and cold spots in the envelope which might establish thermal stresses therein.

The shield is effectively grounded to the equipment chassis through the connection of the skirt 13 to the ring 15, which is positively made and retained by the engagement of the projections 19 in the slots 18 by axial and rotary movements of the shield 11 as it is mounted on the socket ring 15. This connection is furthermore one of low thermal resisitivity to facilitate conduction of heat from the shield 11 to the ring 15 and the equipment chassis.

The heat dissipating characteristics of the shield, both to the ambient atmosphere through the greatly augmented heat dissipating surfaces and to the equipment chassis, effectively lower the operating temperatures of the component envelope and of the elements therein below the temperatures which they attain when run "bare bulb" without any shield or other structure thereabout. This greatly increases the life of the component and its efficiency of operation, and reduces heat-induced noise and distortion of the signal. The shield according to the present invention is of lightweight, economical construction and is highly efficient both as an electrical shield and as a heat dissipator for lowering the operating temperature of the component over which it is mounted.

While a certain preferred embodiment of the invention has been specifically illustrated and described, it is understood that the invention is not limited thereto, as many variations will be apparent to those skilled in the art, and the invention is to be given its broadest interpretation within the terms of the following claims.

I claim:

1. A heat dissipating, electrical shield for an electronic component having a non-metallic envelope comprising: a substantially continuous sheet metal envelope presenting a substantially continuous internal cylindrical surface formed to closely embrace substantially the entire periphery of a cylindrical non-metallic envelope of the component in good heat conducting contact therewith, and forming a shield against ambient electrical fields; integral flattened folds projecting outwardly from and extending axially of said shield envelope to form longitudinal fins augmenting the heat dissipating surface area of the shield; and spring rings surrounding and engaging said shield envelope above and below said longitudinal fins for increasing the contact pressure between the engaging surfaces of the shield and component envelopes.

2. A heat dissipating, electrical shield for an electronic component having a non-metallic envelope comprising: a substantially continuous sheet metal envelope formed to closely embrace the non-metallic envelope of the component in good heat conducting contact therewith, and forming a shield against ambient electrical fields; integral flattened folds projecting outwardly from and extending axially of said shield envelope to form longitudinal fins augmenting the heat dissipating surface area of the shield, said shield envelope being composed of axially extending strips transversely curved to be internally concave and extending between said projecting fins to form a substantially continuous internal cylindrical surface adapted to engage substantially the entire periphery of a cylindrical component envelope, said strips extending above said projecting fins and being bent inwardly to form substantially an end flange; and a cap portion mounted over said strip ends and permanently bonded thereto to rigidly secure the strips together.

3. A heat dissipating, electrical shield for an electronic component having a non-metallic envelope comprising: a substantially continuous sheet metal envelope formed to closely embrace the non-metallic envelope of the component in good heat conducting contact therewith, and forming a shield against ambient electrical fields; integral flattened folds projecting outwardly from and extending axially of said shield envelope to form longitudinal fins augmenting the heat dissipating surface area of the shield, said shield envelope being composed of axially extending strips transversely curved to be internally concave and extending between said projecting fins to form a substantially continuous internal cylindrical surface adapted to engage substantially the entire periphery of a cylindrical component envelope, the diameter of said cylindrical surface being slightly less than the diameter of said component envelope so that mounting of the shield is accompanied by a slight separation of the strips against the resilience of the folded projections to effect resilient contact between the engaging surfaces of the shield and component; and substantially annular spring means surrounding and engaging the shield envelope above and below said longitudinal fins to increase the force of said resilient surface contact.

4. A heat dissipating, electrical shield for an electronic component having a non-metallic envelope comprising: a sheet metal envelope formed to closely embrace the non-metallic envelope of the component in good heat conducting contact therewith, and forming a shield against ambient electrical fields; integral folds projecting outwardly from and extending axially of said shield envelope to form longitudinal fins augmenting the heat dissipating surface area of the shield, said shield envelope being composed of axially extending strips transversely curved to be internally concave and extending between said projecting fins to form a substantially continuous internal cylindrical surface adapted to engage substantially the entire periphery of a cylindrical component envelope, said strips extending below said projecting fins and outwardly of the projected cylinder of the shield surface; and a cylindrical skirt rigidly and permanently joining said outwardly extended strip extensions below said fins and providing means for securing the shield to an electronic chassis in good thermal and electrical contact therewith.

5. A heat dissipating, electrical shield for an electronic component having a non-metallic envelope comprising: a sheet metal envelope formed to closely embrace the non-metallic envelope of the component in good heat conducting contact therewith, and forming a shield against ambient electrical fields; integral folds projecting outwardly from and extending axially of said shield envelope to form longitudinal fins augmenting the heat dissipating surface area of the shield, said shield envelope being composed of axially extending strips transversely curved to be internally concave and extending between said projecting fins to form a substantially continuous internal cylindrical surface adapted to engage substantially the entire periphery of a cylindrical component envelope, said strips extending below said projecting fins; and a pair of cylindrical members permanently bonded respectively to the interior and exterior of said strip extensions to rigidly connect the members and strip extensions together to form a depending skirt by which the shield is mechanically, electrically and thermally connected to an electronic chassis.

6. A heat dissipating, electrical shield for an electronic component having a non-metallic envelope comprising: a sheet metal envelope formed to closely embrace the non-metallic envelope of the component in good heat conducting contact therewith, and forming a shield against ambient electrical fields; integral folds projecting outwardly from and extending axially of said shield envelope to form longitudinal fins augmenting the heat dissipating surface area of the shield, said shield envelope being composed of axially extending strips transversely curved to be internally concave and extending between said projecting fins to form a substantially continuous internal cylindrical surface adapted to engage substantially the entire periphery of a cylindrical component envelope, said strips extending both above and below said projecting fins; a cap permanently connecting the upper ends of said strips; and a cylindrical skirt permanently connecting the lower ends of said strips and serving to mount the shield over a component socket.

7. A heat dissipating, electrical shield for an electronic component having a non-metallic envelope comprising: a substantially continuous sheet metal envelope formed to closely embrace the non-metallic envelope of the component in good heat conducting contact therewith, and forming a shield against ambient electrical fields; integral flattened folds projecting outwardly from and extending axially of said shield envelope to form longitudinal fins augmenting the heat dissipating surface area of the shield, said shield envelope being composed of axially extending strips transversely curved to be internally concave and extending between said projecting fins to form a substantially continuous internal cylindrical surface adapted to engage substantially the entire periphery of a cylindrical component envelope; and an annular spring surrounding and engaging said shield envelope both above and below said projecting fins to increase the contact pressure between the engaging surfaces of the shield and component envelopes.

References Cited by the Examiner

UNITED STATES PATENTS

| | | | |
|---|---|---|---|
| 2,080,913 | 5/37 | Hafecost et al. | 174—35 |
| 2,711,382 | 6/55 | Smith-Johannsen | 174—35 |
| 2,745,895 | 5/56 | Lideen | 174—35 |
| 2,859,383 | 11/58 | Woods et al. | 313—85 |
| 2,905,742 | 9/59 | Woods | 174—35 |
| 3,023,264 | 2/62 | Allison | 174—35 |
| 3,152,217 | 10/64 | Balchaitis | 174—35 |

FOREIGN PATENTS

| | | |
|---|---|---|
| 854,296 | 11/60 | Great Britain. |

JOHN F. BURNS, *Primary Examiner.*

GEORGE WESTBY, DARRELL L. CLAY, *Examiners.*